(12) United States Patent
Chang

(10) Patent No.: US 8,058,568 B2
(45) Date of Patent: Nov. 15, 2011

(54) CIRCUIT BOARD AND METHOD FOR FABRICATING THE SAME

(75) Inventor: Chia-Wei Chang, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 720 days.

(21) Appl. No.: 12/188,551

(22) Filed: Aug. 8, 2008

(65) Prior Publication Data

US 2009/0038838 A1 Feb. 12, 2009

(30) Foreign Application Priority Data

Aug. 8, 2007 (TW) .............................. 96129155 A

(51) Int. Cl.
*H05K 1/11* (2006.01)
*H05K 1/00* (2006.01)
*H05K 1/09* (2006.01)

(52) U.S. Cl. ........ 174/264; 174/255; 174/258; 174/259; 361/767

(58) Field of Classification Search ........................ None
See application file for complete search history.

(56) References Cited

U.S. PATENT DOCUMENTS

| | | | | |
|---|---|---|---|---|
| 6,323,435 B1* | 11/2001 | Strandberg et al. | ........... | 174/255 |
| 6,329,610 B1* | 12/2001 | Takubo et al. | ................ | 174/264 |
| 6,734,542 B2* | 5/2004 | Nakatani et al. | ............... | 257/687 |
| 6,742,250 B2* | 6/2004 | Takahashi | ........................ | 29/847 |
| 6,759,318 B1* | 7/2004 | Chang | .......................... | 438/612 |
| 7,071,424 B1* | 7/2006 | Shirai et al. | .................... | 174/263 |
| 7,446,263 B2* | 11/2008 | En | .................................. | 174/262 |
| 7,690,109 B2* | 4/2010 | Mori et al. | ...................... | 29/852 |
| 2006/0180344 A1* | 8/2006 | Ito et al. | ........................ | 174/262 |

* cited by examiner

*Primary Examiner* — Boris Chervinsky
(74) *Attorney, Agent, or Firm* — Schmeiser Olsen & Watts LLP

(57) ABSTRACT

A circuit board and a method for fabricating the same are provided. The circuit board includes a core board, a first bonding layer disposed on the core board, and a first wiring layer disposed on the first bonding layer. The first bonding layer enables the first wiring layer to be bonded to the core layer better, thereby preventing delamination and forming a fine-pitch wiring layer.

8 Claims, 13 Drawing Sheets

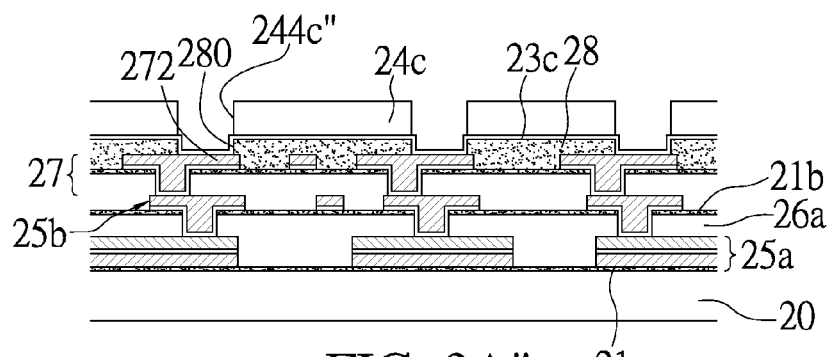
FIG. 3A"
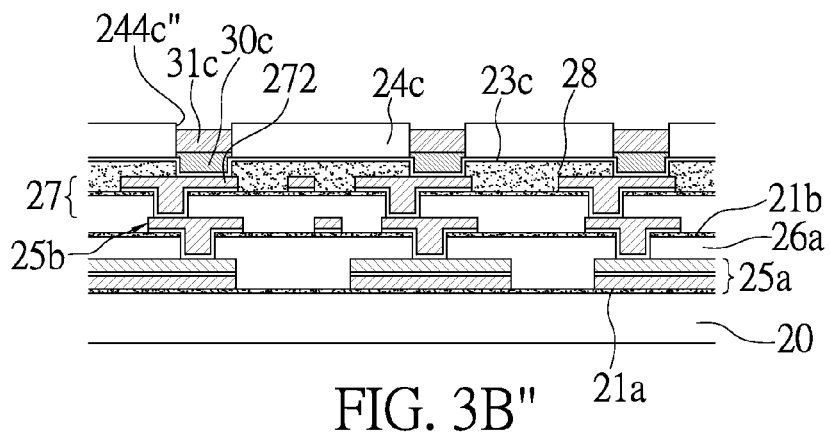
FIG. 3B"
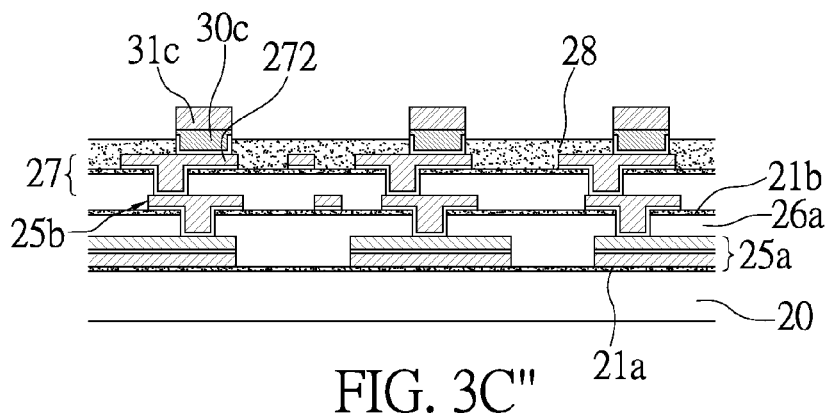
FIG. 3C"
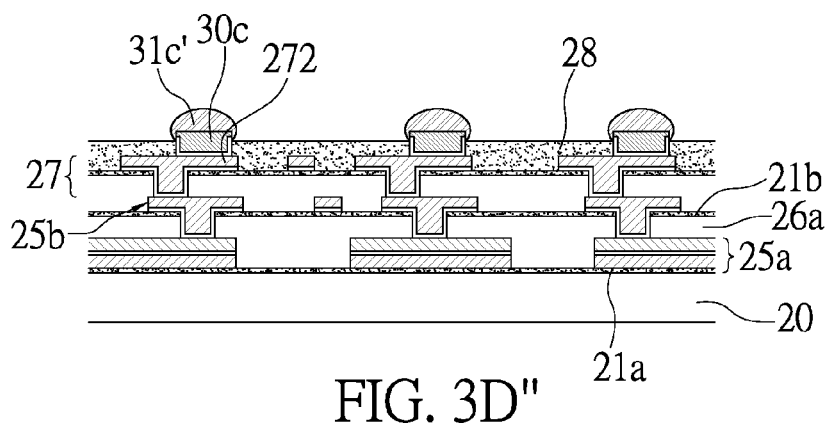
FIG. 3D"

CIRCUIT BOARD AND METHOD FOR FABRICATING THE SAME

BACKGROUND OF THE INVENTION

1. Field of the Invention

The present invention relates to circuit boards and methods for fabricating the same, and more particularly, to a circuit board with a wiring layer bonded to a surface of the circuit board by a material with high bonding strength.

2. Description of the Prior Art

To enhance precision of the circuit layout of circuit boards for use in semiconductor chip packaging, a build-up technique has been developed, which involves stacking a plurality of dielectric layers and wiring layers on a core circuit board, and forming a plurality of plated through holes (PTHs) in the core circuit board, wherein the PTHs are conductive to circuits on upper and lower surfaces of the core circuit board. FIGS. 1A to 1N show a conventional method for fabricating the core circuit board.

Referring to FIG. 1A, a core board 10 in the form of a copper coated laminate (CCL) is provided. A first metal layer 11a, which is made of copper and has good electrical conductivity, is formed on at least one surface of the core board 10.

Referring to FIG. 1B, a thinning step is performed on the first metal layer 11a by a chemical or physical technique as appropriate, so as to form a first thinned metal layer 11a'.

Referring to FIG. 1C, a first conductive layer 12a is formed on the thinned metal layer 11'.

Referring to FIG. 1D, a first plated metal layer 11b is plated to and formed on the first conductive layer 12a.

Referring to FIG. 1E, a first resist layer 13a is formed on the first plated metal layer 11b, and a plurality of first openings 131a are formed in the first resist layer 13a to expose a portion of the first plated metal layer 11b.

Referring to FIG. 1F, portions of the first plated metal layer 11b, the first conductive layer 12a, and the first thinned metal layer 11a', which are not covered by the first resist layer 13a, are removed, so as to form a first wiring layer 14a on the core board 10.

Referring to FIG. 1G, the first resist layer 13a is removed, so as to expose the first wiring layer 14a.

Referring to FIG. 1H, a second metal layer 11c with a lower surface thereof being covered by a dielectric layer 141 is formed on the core board 10 and the first wiring layer 14a, wherein the dielectric layer 141 is a prepreg.

Referring to FIG. 1I, the second metal layer 11c is thinned so as to form a second thinned metal layer 11c'.

Referring to FIG. 1J, a plurality of openings 1410 are formed in the second thinned metal layer 11c' and the dielectric layer 141 so as to expose a portion of the first wiring layer 14a.

Referring to FIG. 1K, a second conductive layer 12b is formed on the second thinned metal layer 11c', the surface of the openings 1410, and the exposed portion of the first wiring layer 14a. Then, a second resist layer 13b is formed on the second conductive layer 12b, wherein a plurality of second openings 132b are formed in the second resist layer 13b such that the second openings 132b correspond in position to and expose the openings 1410 of the dielectric layer 141 and a portion of the second conductive layer 12b.

Referring to FIG. 1L, a second wiring layer 14b is plated into the second openings 132b of the second resist layer 13b via the second conductive layer 12b, and a plurality of conductive vias 142 are plated into the openings 1410 of the dielectric layer 141 such that the conductive vias 142 are electrically connected to the first wiring layer 14a.

Referring to FIG. 1M, the second resist layer 13b and the second conductive layer 12b thereunder are removed so as to expose the second wiring layer 14b.

Referring to FIG. 1N, the steps depicted in FIGS. 1H to 1M can be repeated, so as to form a circuit build-up structure 14. The circuit build-up structure 14 comprises the dielectric layer 141, the second wiring layer 14b superimposed on the dielectric layer 141, and the conductive vias 142 formed in the dielectric layer 141 and electrically connected to the second wiring layer 14b. The circuit build-up structure 14 further comprises a plurality of electrically connecting pads 143 conductive to the second wiring layer 14b. An insulated protection layer 15A, such as a solder mask, is formed on the circuit build-up structure 14. A plurality of openings 150 is formed in the insulated protection layer 15. The openings 150 correspond in position to and expose the electrically connecting pads 143.

The core board 10 and the dielectric layer 141 are made of insulating material. The first, second and third metal layers 11a, 11b, 11c are made of metallic material. Metallic material can be bonded to non-metal material but hardly firmly. Hence, the core board 10 is unlikely to be bonded to the first wiring layer 14a firmly, and the dielectric layer 141 is unlikely to be bonded to the second wiring layer 14b firmly, thereby leading to peel or delamination in a subsequent process readily.

In the event of a fine-pitch circuit, the circuit pitch of the first and second wiring layers 14a, 14b is much less, which further deteriorates the bonding between the first wiring layer 14a and the core board 10 or the bonding between the second wiring layer 14b and the dielectric layer 141, thereby increasing the likelihood of peeling or delamination of the first and second wiring layers 14a, 14b in a subsequent process.

Therefore, the problem to be solved here is to provide a technique for fabricating a circuit board, which can enhance the bonding between a wiring layer made of metallic material and a dielectric layer or core board made of non-metallic material so as to prevent peeling or delamination, reduce the thickness of the metal layer, and facilitate formation of a fine-pitch wiring layer.

SUMMARY OF THE INVENTION

To overcome the drawbacks of the prior art, a primary objective of the present invention is to provide a circuit board and a method for fabricating the same so as to enhance the bonding between a core board and a metal layer by a bonding layer.

Another objective of the present invention is to provide a circuit board and a method for fabricating the same so as to facilitate fabrication of a fine-pitch circuit.

To achieve the above and other objectives, the present invention provides a circuit board, comprising: a core board; a first bonding layer disposed on the core board; and a first wiring layer disposed on the first bonding layer. The first wiring layer comprises a first thinned metal layer, a first conductive layer, and a first plated metal layer. The first thinned metal layer is formed by thinning down a first metal layer. A portion of the first wiring layer is defined with a plurality of first lands.

The present invention further provides another circuit board, comprising: a core board; a first bonding layer disposed on the core board; and a first wiring layer disposed on the first bonding layer, and comprising a first conductive layer and a first plated metal layer. A portion of the first wiring layer is defined with a plurality of first lands.

The circuit board of the present invention further comprises: a first dielectric layer disposed on the first wiring layer and the first bonding layer; a second bonding layer disposed on the first dielectric layer; a second wiring layer disposed on the second bonding layer, wherein a portion of the second wiring layer is defined with a plurality of second lands; and a second conductive layer disposed between the second bonding layer and the second wiring layer.

The circuit board of the present invention further comprises: a circuit build-up structure disposed on the second wiring layer and the second bonding layer, the circuit build-up structure comprising: at least a second dielectric layer, a third bonding layer superimposed on the second dielectric layer, a third wiring layer superimposed on the third bonding layer, and a plurality of conductive vias formed in the second dielectric layer and electrically connected to the third wiring layer. The conductive vias are electrically connected to the second lands defined in the second wiring layer. The circuit build-up structure further comprises a plurality of electrically connecting pads conductive to the third wiring layer. An insulated protection layer is disposed on the circuit build-up structure and is formed with openings to expose the electrically connecting pads.

The circuit board of the present invention further comprises: a plurality of conductive posts formed on the electrically connecting pads; and a conductive material, such as solder, formed on the conductive posts. A reflowing step is performed on the conductive material so as to form conductive components for covering the conductive posts.

The present invention further provides a method for fabricating a circuit board. The method comprises the steps of: providing a core board having a first metal layer bonded thereon via a first bonding layer; thinning down the first metal layer so as to form a first thinned metal layer; forming a first conductive layer on the first thinned metal layer; forming a first plated metal layer on the first conductive layer; forming a first resist layer on the first plated metal layer, and forming a plurality of first openings in the first resist layer such that a portion of the first plated metal layer is exposed from the first openings; removing the first plated metal layer, the first conductive layer, and the first thinned metal layer from the first openings so as to form a first wiring layer on the core board, wherein a portion of the first wiring layer is defined with a plurality of first lands; and removing the first resist layer so as to expose the first wiring layer and the first bonding layer.

The present invention further provides another method for fabricating a circuit board, comprising the steps of: providing a core board having a first metal layer bonded thereon via a first bonding layer; thinning down the first metal layer so as to form a first thinned metal layer; forming a first conductive layer on the first thinned metal layer; removing the first thinned metal layer so as to expose the first bonding layer; forming a first conductive layer on the first bonding layer; plating a first plated metal layer to the first conductive layer; forming a first resist layer on the first plated metal layer, and forming a plurality of first openings in the first resist layer such that a portion of the first plated metal layer is exposed from the first openings; removing the first plated metal layer, the first conductive layer, and the first thinned metal layer from the first openings so as to form a first wiring layer on the core board, wherein a portion of the first wiring layer is defined with a plurality of first lands; and removing the first resist layer so as to expose the first wiring layer and the first bonding layer.

The method of the present invention further comprises the steps of: forming a first dielectric layer on the first wiring layer and the first bonding layer; forming a second metal layer on the first dielectric layer, the second metal layer having a second bonding layer; thinning down the second metal layer so as to form a second thinned metal layer; forming a plurality of first holes in the second thinned metal layer, the second bonding layer, and the first dielectric layer by laser ablation, thereby allowing a portion of the first lands to be exposed from the first holes; removing the second thinned metal layer so as to expose the second bonding layer; forming a second conductive layer on the second bonding layer, a surface of the first holes, and a portion of the first lands; forming a second resist layer on the second conductive layer, forming a plurality of second openings in the second resist layer such that a portion of the second conductive layer is exposed from the second openings, and forming a plurality of third openings in the second resist layer such that the first holes of the first dielectric layer are exposed from the third openings; plating a second wiring layer in the second openings of the second resist layer wherein a portion of the second wiring layer is defined with a plurality of second lands, and forming in the third openings a plurality of conductive vias conductive to the first lands defined in the first wiring layer; and removing the second resist layer and the second conductive layer thereunder so as to expose the second wiring layer, the second lands, and the second bonding layer.

The method of the present invention further comprises the step of: forming a circuit build-up structure on the second wiring layer and the second bonding layer. The circuit build-up structure comprises at least a second dielectric layer, a third bonding layer superimposed on the second dielectric layer, a third wiring layer superimposed on the third bonding layer, and a plurality of conductive vias formed in the second dielectric layer and electrically connected to the third wiring layer. The conductive vias are electrically connected to the second lands defined in the second wiring layer. The circuit build-up structure further comprises a plurality of electrically connecting pads conductive to the third wiring layer. An insulated protection layer is formed on the circuit build-up structure. A plurality of openings is formed in the insulated protection layer such that the electrically connecting pads are exposed from the openings of the insulated protection layer.

The method of the present invention further comprises the steps of: forming a plurality of conductive posts on the electrically connecting pads; forming on the conductive posts a conductive material, such as solder. The conductive posts and the conductive material are fabricated by the steps of: forming a third conductive layer on the insulated protection layer, the surface of the openings of the insulated protection layer, and the electrically connecting pads exposed from the openings of the insulated protection layer; forming a third resist layer on the third conductive layer, and forming a plurality of fourth openings in the third resist layer such that the fourth openings correspond in position to and expose the openings of the insulated protection layer respectively, wherein the diameter of the fourth openings is greater than, equal to, or less than that of the openings of the insulated protection layer; plating the conductive posts to the third conductive layer exposed from the fourth openings such that the conductive posts are electrically connected to the electrically connecting pads; plating the conductive material to the conductive posts; and removing the third resist layer and the third conductive layer thereunder so as to expose the conductive posts and the conductive material, wherein a reflowing step is performed on the conductive material so as to form conductive components for covering the conductive posts.

The circuit board and the method for fabricating the same according to the present invention have the following features. The core board, the first dielectric layer, and the second dielectric layer are made of non-metallic material. The first, second, and third wiring layers are made of metallic material. Metallic material can be bonded to non-metallic material via the first, second, and third bonding layers, thereby enhancing the bonding between the metallic material and the non-metallic material, increasing the bonding strength of fine-pitch circuits, and preventing delamination from occurring to a subsequent process.

BRIEF DESCRIPTION OF THE DRAWINGS

FIGS. 3A' to 3D' are cross-sectional views showing the steps of a second embodiment of forming conductive posts and a conductive material on electrically connecting pads according to the method for fabricating a circuit board of the present invention;

FIGS. 3A" to 3D" are cross-sectional views showing the steps of a third embodiment of forming conductive posts and a conductive material on electrically connecting pads according to the method for fabricating a circuit board of the present invention.

DETAILED DESCRIPTION OF THE PREFERRED EMBODIMENTS

Illustrative embodiments of a circuit board and a method for fabricating the same provided in the present invention are described as follows with reference to FIGS. 2 to 4. It should be understood that the drawings are simplified schematic diagrams only showing the components relevant to the present invention, and the layout of components could be more complicated in practical implementation.

First Embodiment

Figure 1A:
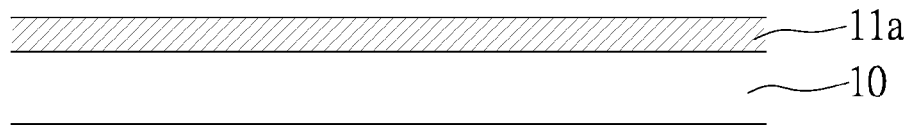
FIGS. 1A to 1N (PRIOR ART) are cross-sectional views showing the steps of a conventional method for fabricating a circuit board.
Figure 1B:
Figure 1C:
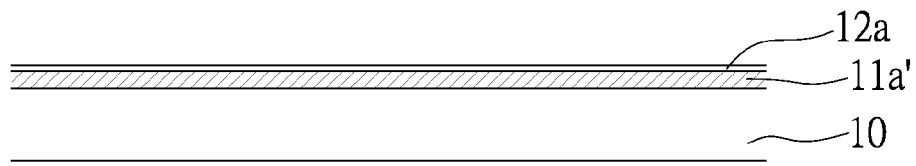
Figure 1D:
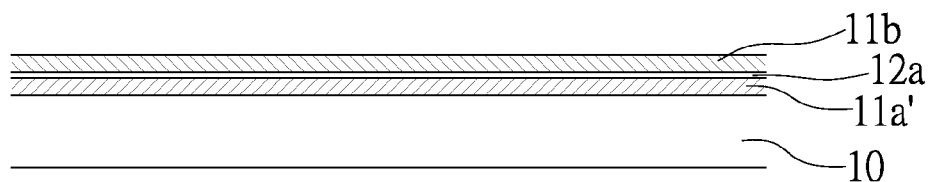
Figure 1E:
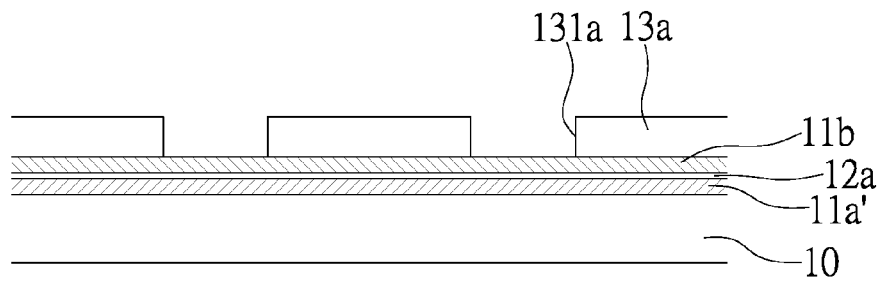
Figure 1F:
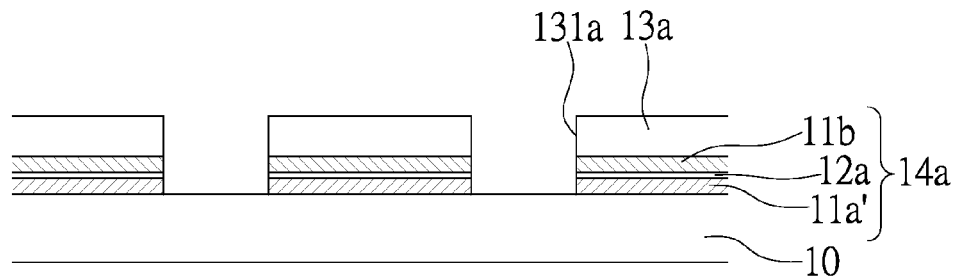
Figure 1G:
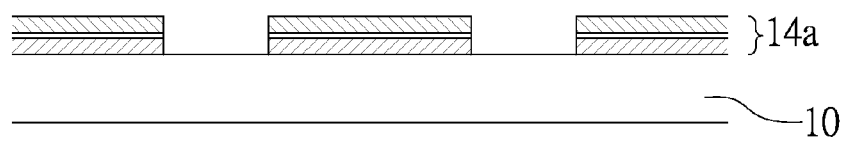
Figure 1H:
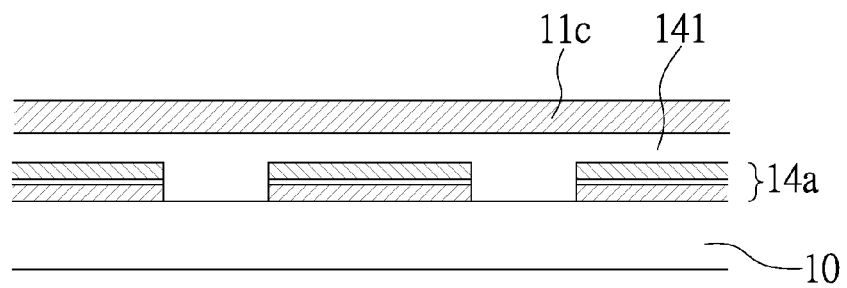
Figure 1I:
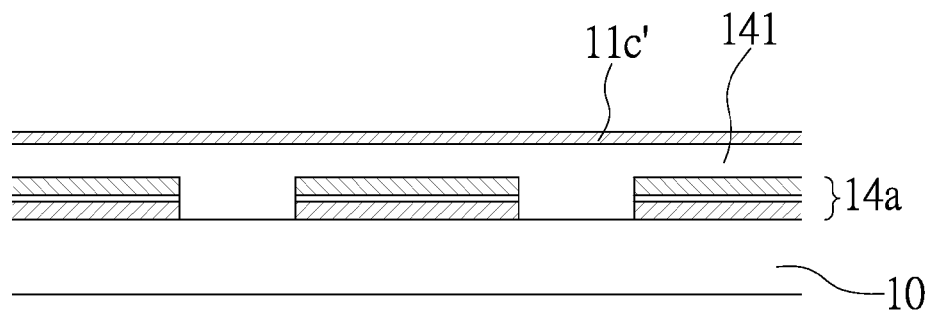
Figure 1J:
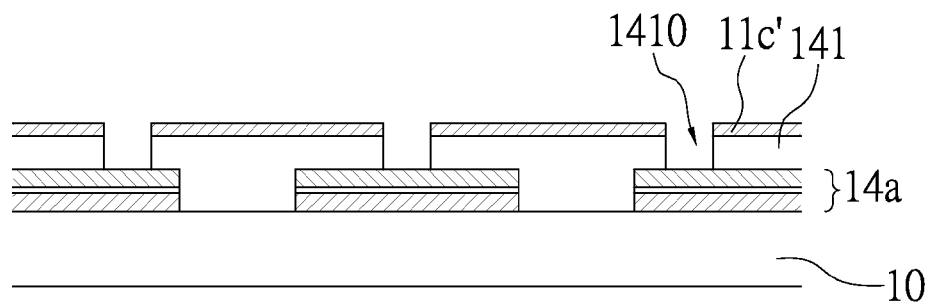
Figure 1K:
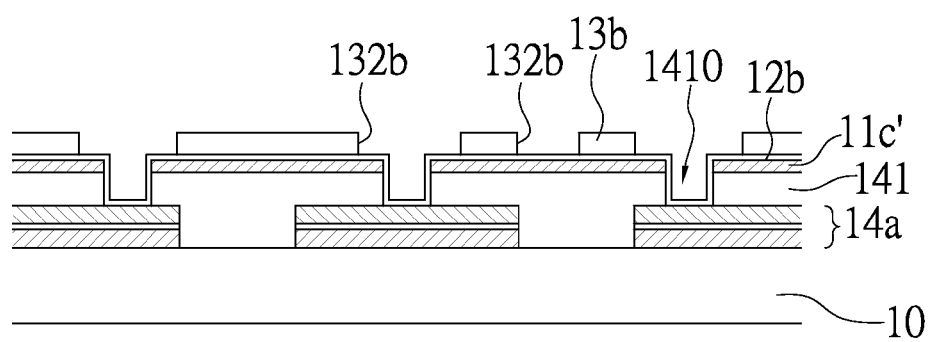
Figure 1L:
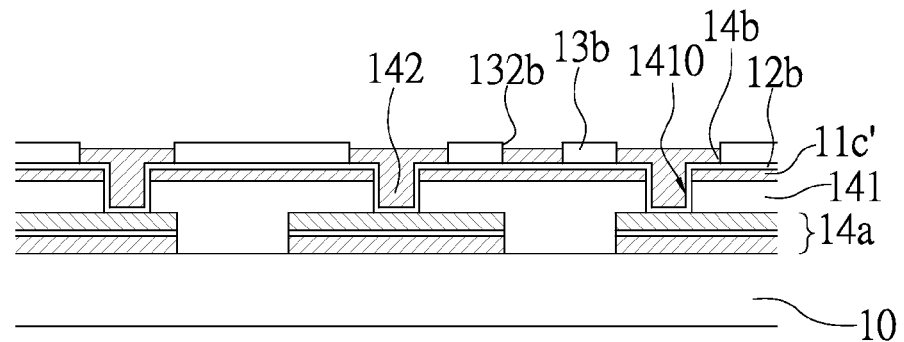
Figure 1M:
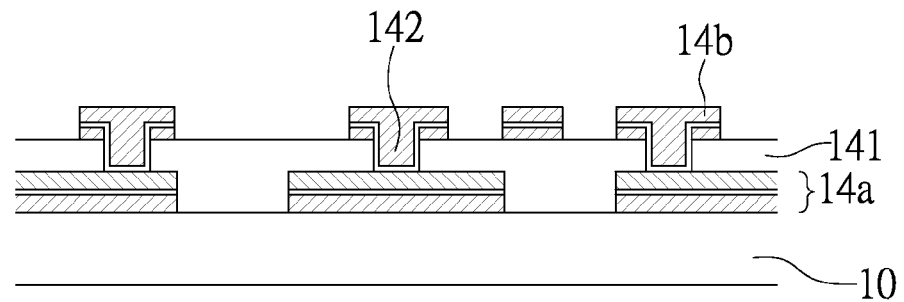
Figure 1N:
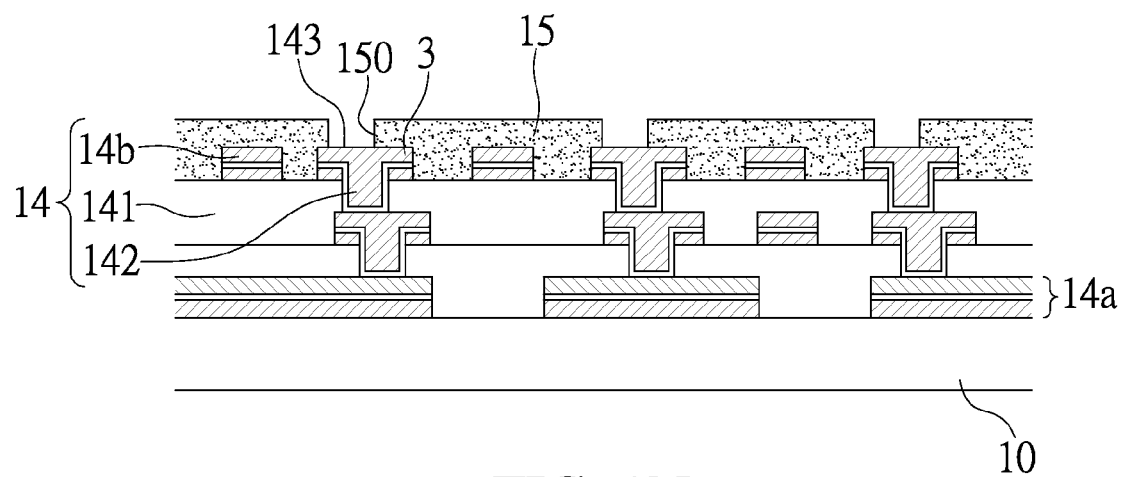
Figure 2A:
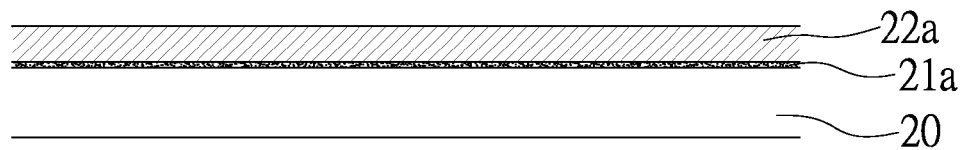
FIGS. 2A to 2P are cross-sectional views showing the steps of a method for fabricating a circuit board according to a first embodiment of the present invention.
Figure 2B:
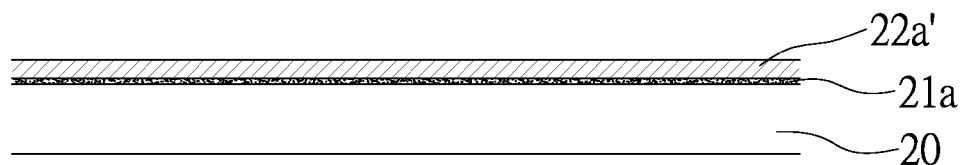
Figure 2C:
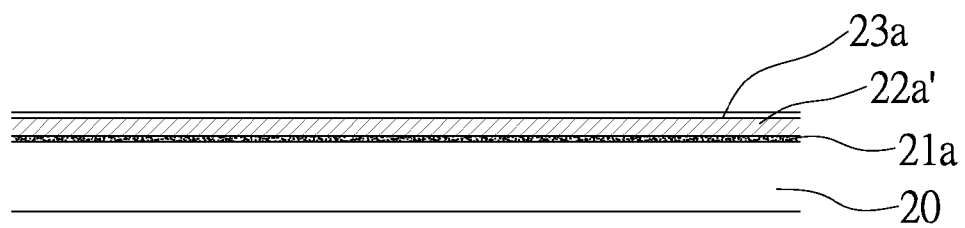
Figure 2D:
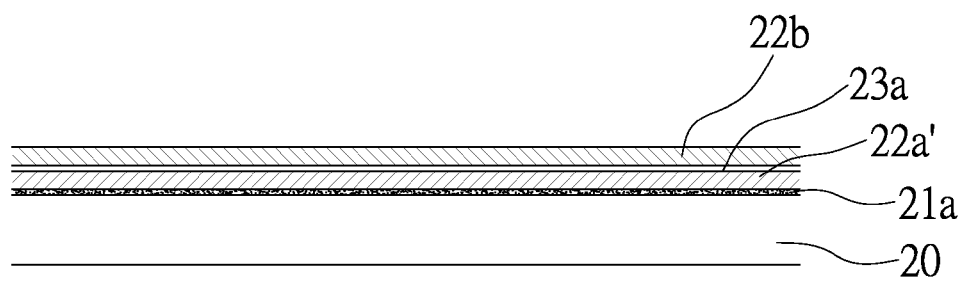
Figure 2E:
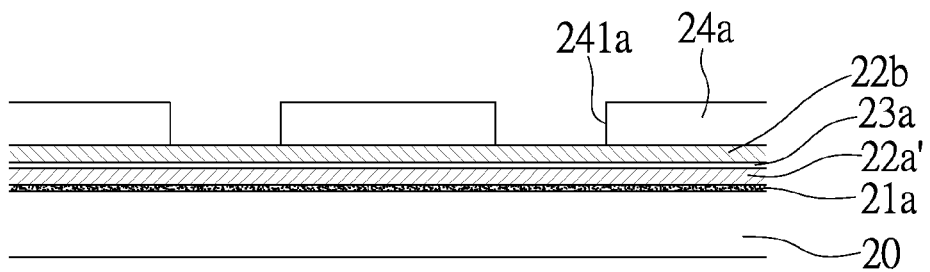
Figure 2F:
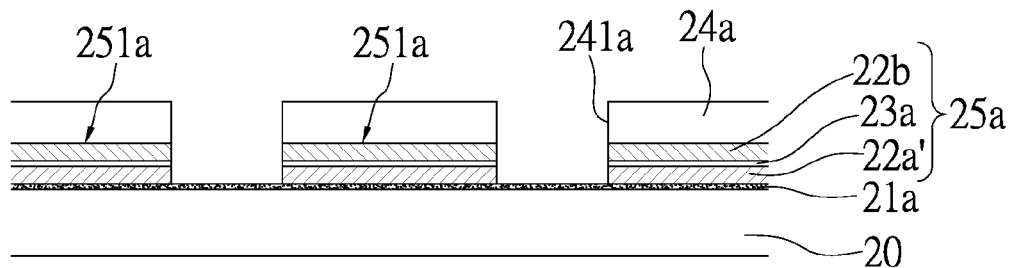
Figure 2G:
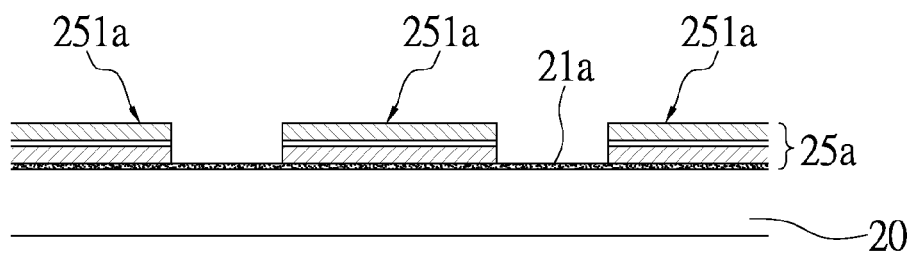
Figure 2H:
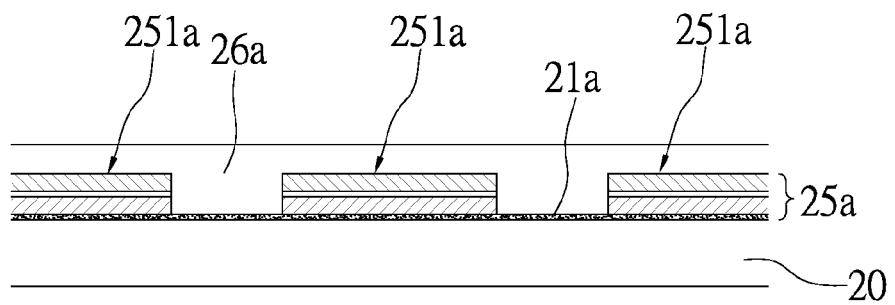
Figure 2I:
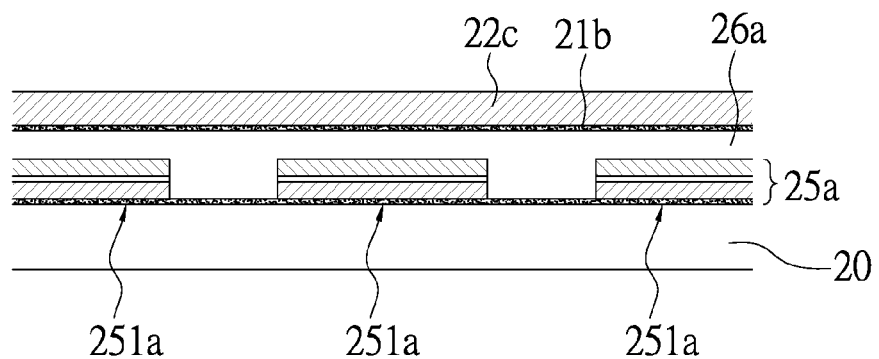
Figure 2J:
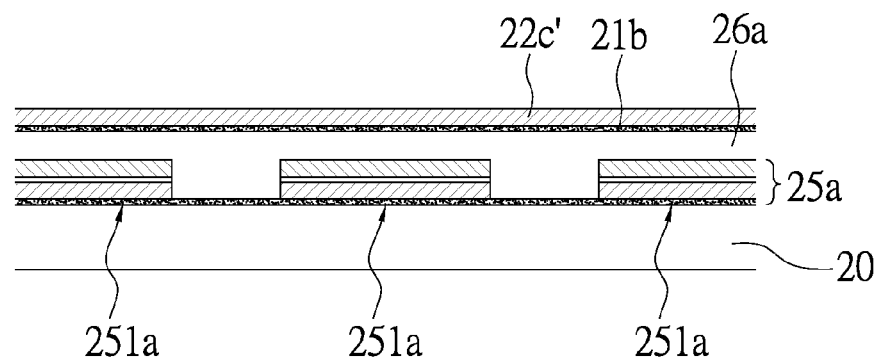
Figure 2K:
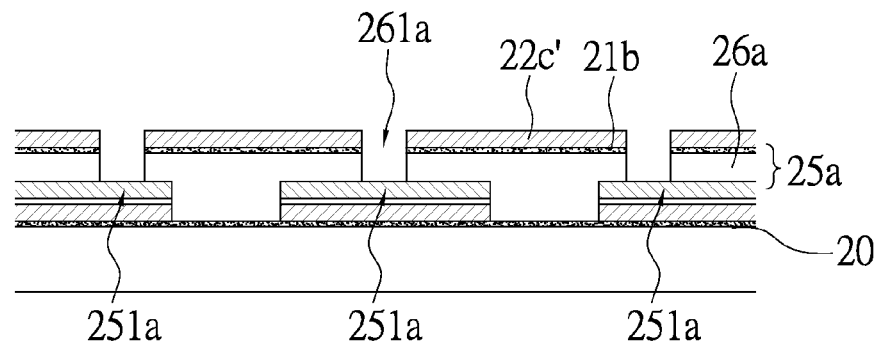
Figure 2L:
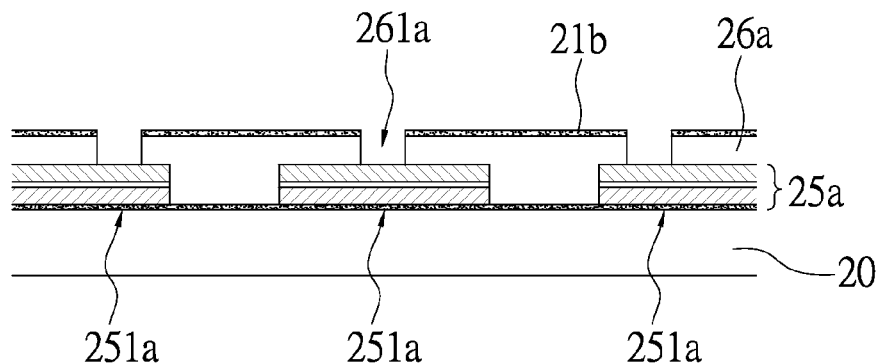
Figure 2M:
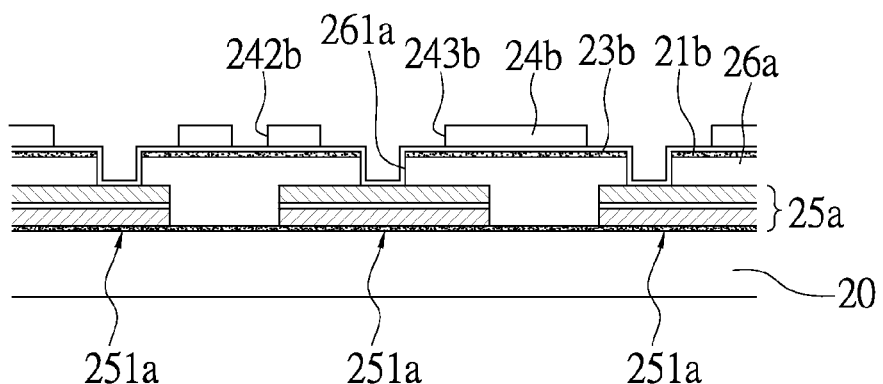
Figure 2N:
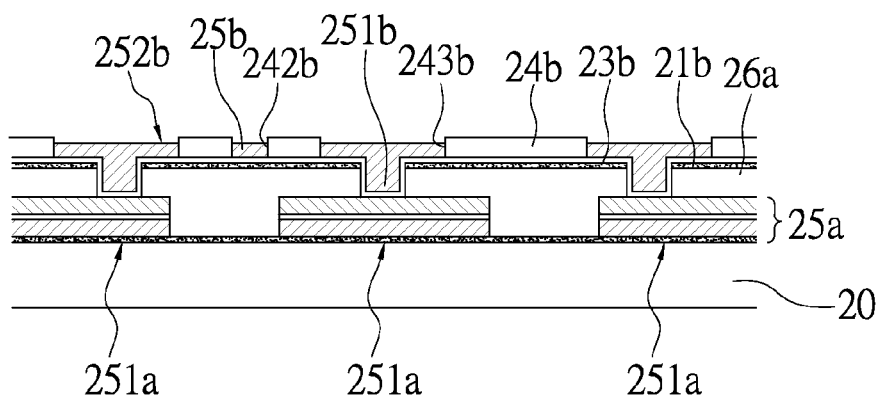
Figure 2O:
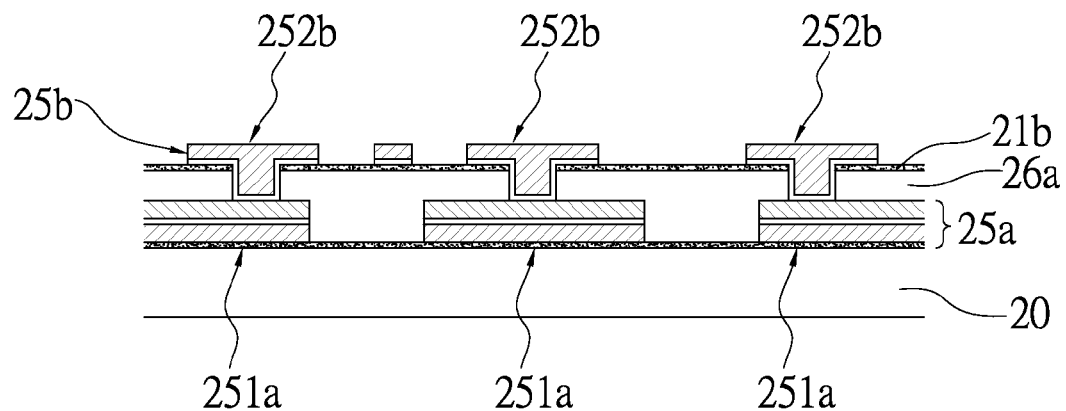
Figure 2P:
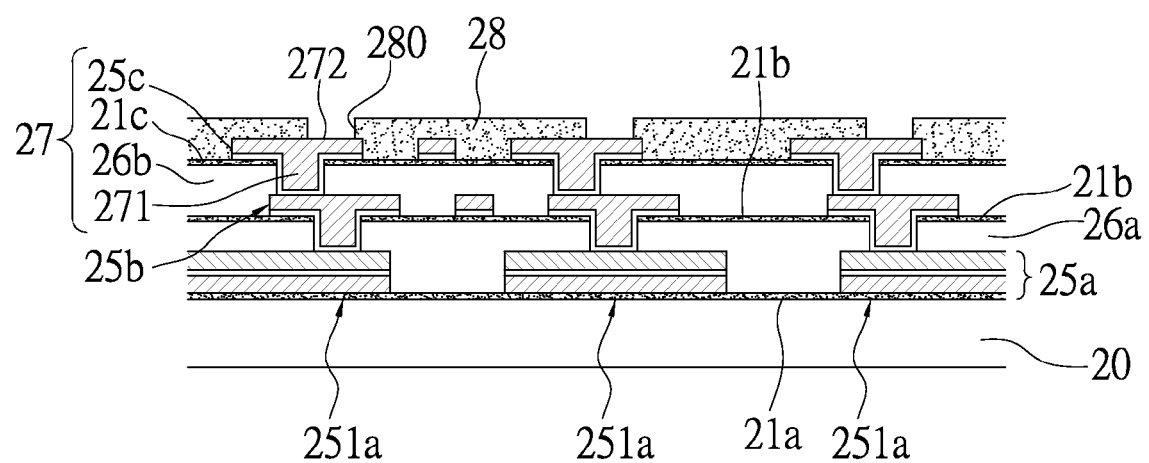

FIGS. 2A to 2P are cross-sectional views showing the steps of a method for fabricating a circuit board according to a first embodiment of the present invention.

Referring to FIG. 2A, a core board 20 is provided. A first metal layer 22a is bonded on the core board 20 via a first bonding layer 21a. The first bonding layer 21a is made of a material having high bonding strength, such as low profile Cu foil (low PCF) or no profile Cu foil (no PCF) produced by the Mitsubishi Gas Company (MGC).

Referring to FIG. 2B, a thinning step is performed on the first metal layer 22a by a chemical or physical technique as appropriate, so as to form a first thinned metal layer 22a'.

Referring to FIG. 2C, a first conductive layer 23a is formed on the first thinned metal layer 22a'.

Referring to FIG. 2D, a first plated metal layer 22b is plated to and formed on the first conductive layer 23a.

Referring to FIG. 2E, a first resist layer 24a is formed on the first plated metal layer 22b, and a plurality of first openings 241a are formed in the first resist layer 24a such that a portion of the first plated metal layer 22b is exposed from the first openings 241a'.

Referring to FIG. 2F, portions of the first plated metal layer 22b, the first conductive layer 23a, and the first thinned metal layer 22a', which are not covered by the first resist layer 24a, are removed. In other words, the portions of the first plated metal layer 22b, the first conductive layer 23a, and the first thinned metal layer 22a', which are exposed from the first openings 241a, are removed. This is to form a first wiring layer 25a and a plurality of first lands 251a defined on the core board 20.

Referring to FIG. 2G, the first resist layer 24a is removed such that the first wiring layer 25a and the first bonding layer 21a are exposed.

Referring to FIG. 2H, a first dielectric layer 26a is formed on the first wiring layer 25a and the first bonding layer 21a.

Referring to FIG. 2I, a second metal layer 22c with a second bonding layer 21b is formed on the first dielectric layer 26a.

Referring to FIG. 2J, the second metal layer 22c is thinned down to form a second thinned metal layer 22c'.

Referring to FIG. 2K, a plurality of first holes 261a are formed in the second thinned metal layer 22c', the second bonding layer 21b, and the first dielectric layer 26a by laser ablation, thus allowing a portion of the first lands 251a to be exposed from the first holes 261a.

Referring to FIG. 2L, the second thinned metal layer 22c' is removed such that the second bonding layer 21b is exposed.

Referring to FIG. 2M, a second conductive layer 23b is formed on the second bonding layer 21b, the surface of the first holes 261a, and a portion of the first lands 251a. Then, a second resist layer 24b is formed on the second conductive layer 23b, wherein a plurality of second openings 242b are formed in the second resist layer 24b such that a portion of the second conductive layer 23b is exposed from the second openings 242b. Further, a plurality of third openings 243b are formed in the second resist layer 24b so as to expose the first holes 261a of the first dielectric layer 26a.

Referring to FIG. 2N, a second wiring layer 25b is plated in the second openings 242b of the second resist layer 24b, wherein a portion of the second wiring layer 25b is defined with a plurality of second lands 252b, and a plurality of conductive vias 251b are formed in the third openings 243b conductive to the first lands 251a defined in the first wiring layer 25a.

Referring to FIG. 2O, the second resist layer 24b and the second conductive layer 23b thereunder are removed such that the second wiring layer 25b, the second lands 252b, and the second bonding layer 21b are exposed.

Referring to FIG. 2P, the steps depicted in FIGS. 2I to 2O are repeated, so as to form at least a second dielectric layer 26b, a third bonding layer 21c superimposed on the second dielectric layer 26b, a third wiring layer 25c superimposed on the third bonding layer 21c, and a plurality of conductive vias 271 formed in the second dielectric layer 26b, so as to form a circuit build-up structure 27. The conductive vias 271 are electrically connected to the second lands 252b defined in the second wiring layer 25b. The circuit build-up structure 27 further comprises a plurality of electrically connecting pads 272 conductive to the third wiring layer 25c. An insulated protection layer 28, such as a solder mask, is formed on the circuit build-up structure 27. A plurality of openings 280 are formed in the insulated protection layer 28, thereby allowing the electrically connecting pads 272 corresponding in position to the openings 280 to be exposed therefrom respectively.

FIG. 3A through FIG. 3D shows the steps of an embodiment of forming conductive components on the electrically connecting pads.

Figure 3A:
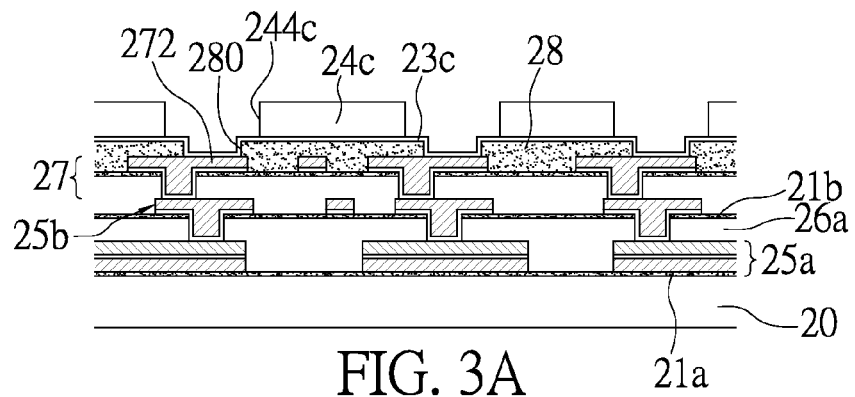
FIGS. 3A to 3D are cross-sectional views showing the steps of a first embodiment of forming conductive posts and a conductive material on electrically connecting pads according to the method for fabricating a circuit board of the present invention.

Referring to FIG. 3A, a third conductive layer 23c is formed on the insulated protection layer 28, the surface of the openings 280, and portions of the electrically connecting pads 272 exposed from the openings 280, and then a third resist layer 24c is formed on the third conductive layer 23c. A plurality of fourth openings 244c are formed in the third resist layer 24c such that the fourth openings 244c correspond in position to and expose the openings 280 of the insulated protection layer 28 respectively. The diameter of the fourth openings 244c is greater than that of the openings 280, allowing the third conductive layer 23c on the electrically connecting pads 272 to be exposed from the fourth openings 244c.

Figure 3B:
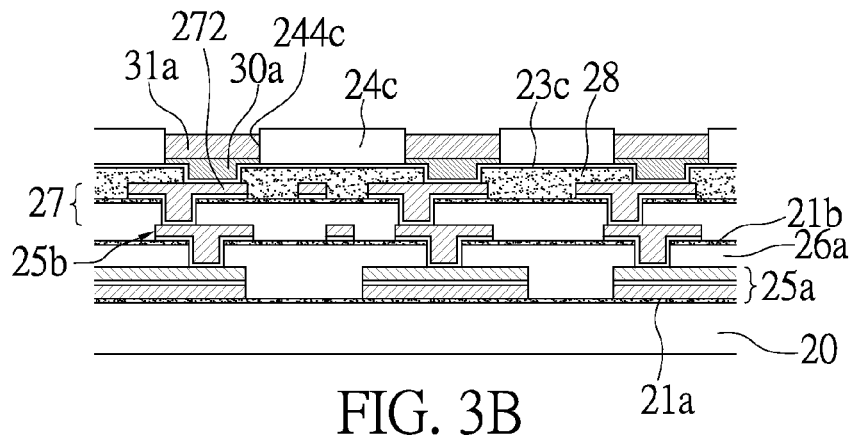

Referring to FIG. 3B, a plurality of conductive posts 30a are plated to the third conductive layer 23c exposed from the fourth openings 244c such that the conductive posts 30a are electrically connected to the electrically connecting pads 272, and then a conductive material 31a is plated to the conductive posts 30a. The conductive material 31a is solder.

Figure 3C:
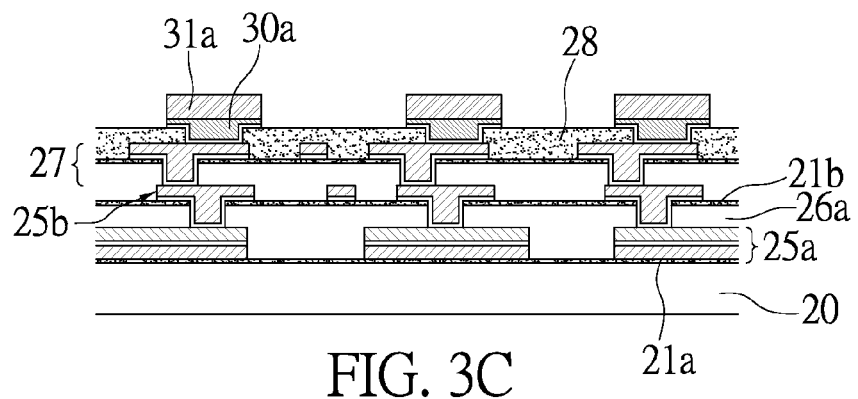

Referring to FIG. 3C, the third resist layer 24c and the third conductive layer 23c thereunder are removed so as to expose the conductive posts 30a and the conductive material 31a.

Figure 3D:
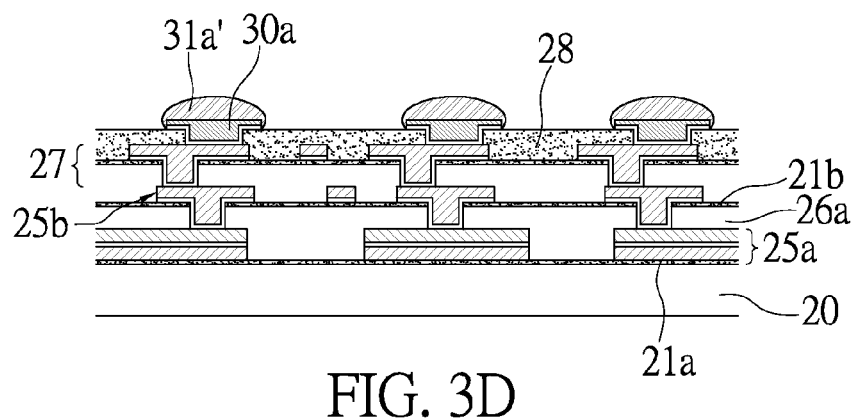
Figure 3A:
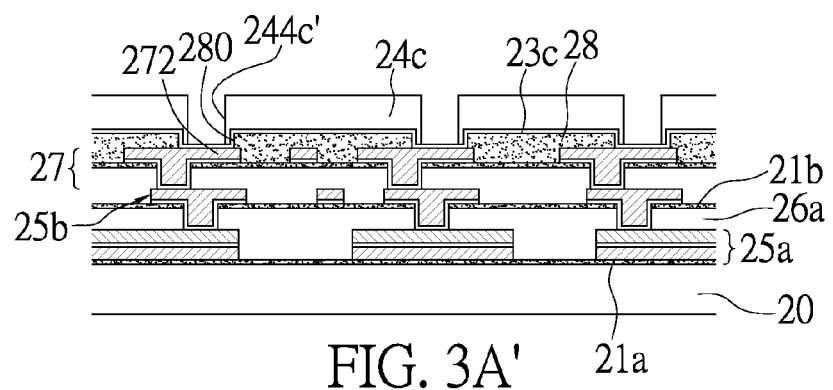
Figure 3B:
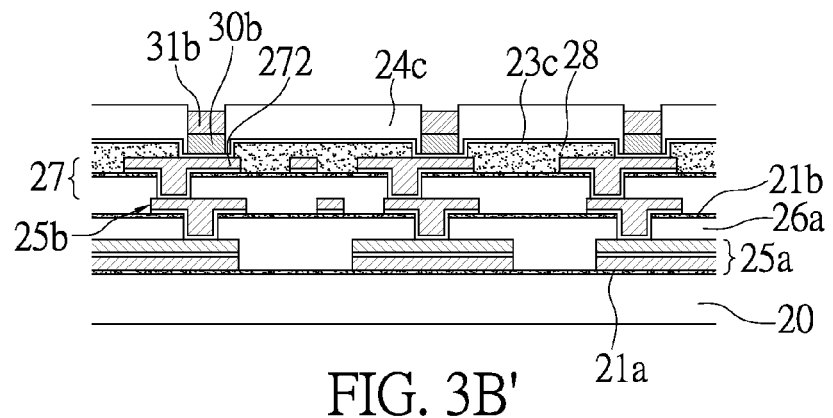
Figure 3C:
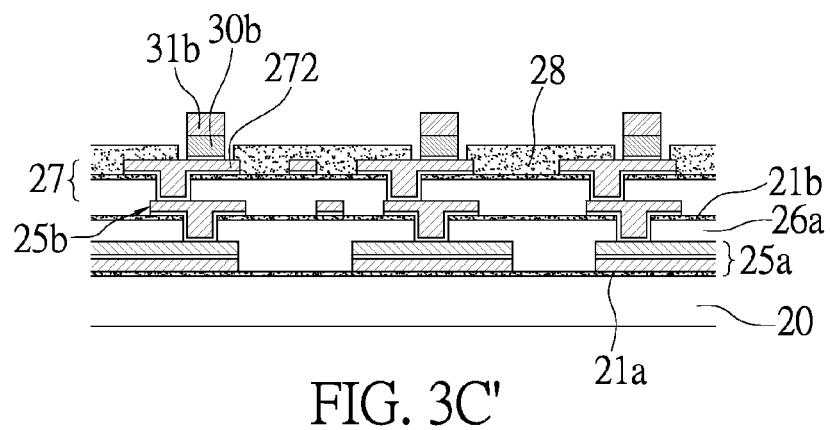
Figure 3D:
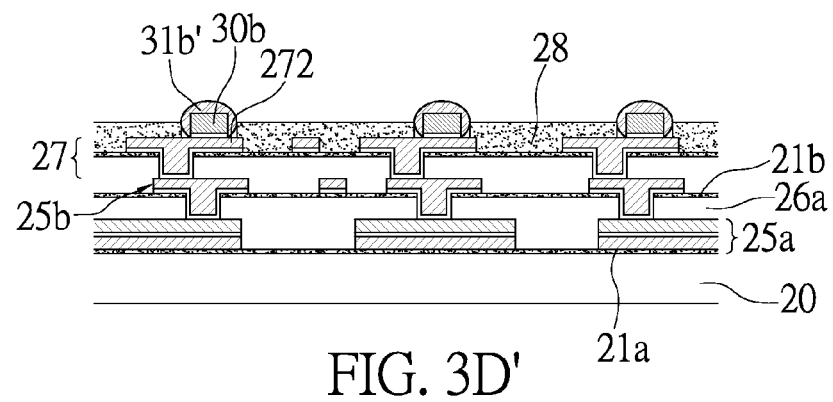

Referring to FIG. 3D, a reflowing step is performed on the conductive material 31a so as to form conductive components 31a' for covering the conductive posts 30a and thereby enable the circuit board to have electrical connection with another electronic device.

FIG. 3A' through FIG. 3C' show another embodiment of forming the conductive components on the electrically connecting pads, which is different from the preceding embodiment in that the diameter of the fourth openings is less than that of the openings of the insulated protection layer.

Referring to FIG. 3A', the structure formed with the third conductive layer 23c as shown in FIG. 3A is provided, and then the third resist layer 24c is formed on the third conductive layer 23c. A plurality of fourth openings 244c' are formed in the third resist layer 24c. The diameter of the fourth openings 244c' is less than that of the openings 280 of the insulated protection layer 28, thereby allowing the third conductive layer 23c on the electrically connecting pads 272 to be exposed from the fourth openings 244c'.

Referring to FIG. 3B', a plurality of conductive posts 30b and a conductive material 31b are plated to and formed on the third conductive layer 23c in the fourth openings 244c' in sequence, allowing the outer diameter of the conductive posts 30b to be equal to the outer diameter of the conductive material 31b.

Referring to FIG. 3C', the third resist layer 24c and the third conductive layer 23c thereunder are removed so as to expose portions of the electrically connecting pads 272, the conductive posts 30b, and the conductive material 31b.

Referring to FIG. 3D', a reflowing step is performed on the conductive material 31b so as to form conductive components 31b' for covering the conductive posts 30b and thereby enable the circuit board to have electrical connection with another electronic device.

FIG. 3A" to FIG. 3C" show a further embodiment of forming conductive components on the electrically connecting pads, which is different from the preceding embodiments in that the diameter of the fourth openings is equal to that of the openings of the insulated protection layer.

Referring to FIG. 3A", the structure formed with the third conductive layer 23c as shown in FIG. 3A is provided, and then the third resist layer 24c is formed on the third conductive layer 23c. A plurality of fourth openings 244c" are formed in the third resist layer 24c. The diameter of the fourth openings 244c" is equal to that of the openings 280 of the insulated protection layer 28, thereby allowing the third conductive layer 23c on the electrically connecting pads 272 to be exposed from the fourth openings 244c".

Referring to FIG. 3B", a plurality of conductive posts 30c and a conductive material 31c are plated to and formed on the third conductive layer 23c in the fourth openings 244c" in sequence.

Referring to FIG. 3C", the third resist layer 24c and the third conductive layer 23c thereunder are removed such that portions of the conductive posts 30c and the conductive material 31c are exposed.

Referring to FIG. 3D", a reflowing step is performed on the conductive material 31c so as to form conductive components 31c' for covering the conductive posts 30c and thereby enable the circuit board to have electrical connection with another electronic device.

By the above fabrication method, the present invention further provides a circuit board, comprising: a core board 20; a first bonding layer 21a disposed on the core board 20; and a first wiring layer 25a disposed on the first bonding layer 21a. A portion of the first wiring layer 25a is defined with a plurality of first lands 251a. The first wiring layer 25a further comprises a first thinned metal layer 22a', a first conductive layer 23a, and a first plated metal layer 22b. The first thinned metal layer 22a' is formed by thinning down a first metal layer 22a.

The circuit board of the present invention further comprises: a first dielectric layer 26a disposed on the first wiring layer 25a and the first bonding layer 21a; a second bonding layer 21b disposed on the first dielectric layer 26a; a second wiring layer 25b disposed on the second bonding layer 21b, wherein a portion of the second wiring layer 25b is defined with a plurality of second lands 252b; and a second conductive layer 23b disposed between the second bonding layer 21b and the second wiring layer 25b.

The circuit board of the present invention further comprises: a circuit build-up structure 27 disposed on the second wiring layer 25b and the second bonding layer 21b. The circuit build-up structure 27 comprises at least a second dielectric layer 26b, a third bonding layer 21c superimposed on the second dielectric layer 26b, a third wiring layer 25c superimposed on the third bonding layer 21c, and a plurality of conductive vias 271 formed in the second dielectric layer 26b and electrically connected to the third wiring layer 25c. The conductive vias 271 are electrically connected to the second lands 252b defined in the second wiring layer 25b. The circuit build-up structure 27 further comprises a plurality of electrically connecting pads 272 conductive to the third wiring layer 25c. The circuit build-up structure 27 has an insulated protection layer 28 disposed thereon. A plurality of openings 280 are formed in the insulated protection layer 28 such that the electrically connecting pads 272 are exposed from the openings 280.

The circuit board of the present invention further comprises: a plurality of conductive posts 30a, 30b, 30c disposed on the electrically connecting pads 272, and a conductive material 31a, 31b, 31c disposed on the conductive posts 30a, 30b, 30c. The conductive material 31a, 31b, 31c is solder. A reflowing step is performed on the conductive material 31a, 31b, 31c so as to form conductive components 31a', 31b', 31c' for covering the conductive posts 30a, 30b, 30c.

As mentioned earlier, the core board 20, the first dielectric layer 26a, and the second dielectric layer 26b are made of non-metallic material, whereas the first, second and third wiring layers 25a, 25b, 25c are made of metallic material.

Metallic material can be bonded to non-metallic material via the first, second and third bonding layers 21a, 21b, 21c, thereby enhancing the bonding between the metallic material and the non-metallic material, increasing the bonding strength of fine-pitch circuits, and preventing delamination from occurring to a subsequent process.

Second Embodiment

FIG. 4A through FIG. 4E are cross-sectional views showing the steps of a method for fabricating a circuit board according to a second embodiment of the present invention. The second embodiment is different from the first embodiment in that in the second embodiment features, the first metal layer is completely removed in the fabrication processes.

Figure 4A:
FIGS. 4A to 4E are cross-sectional views showing the steps of a method for fabricating a circuit board according to a second embodiment of the present invention.

Referring to FIG. 4A, the structure shown in FIG. 2B is provided, and then the first thinned metal layer 22a' is completely removed so as to expose the first bonding layer 21a.

Figure 4B:
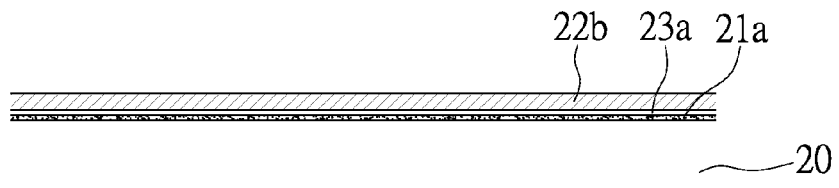

Referring to FIG. 4B, a first conductive layer 23a is formed on the first bonding layer 21a, and then a first plated metal layer 22b is plated to and formed on the first conductive layer 23a.

Figure 4C:
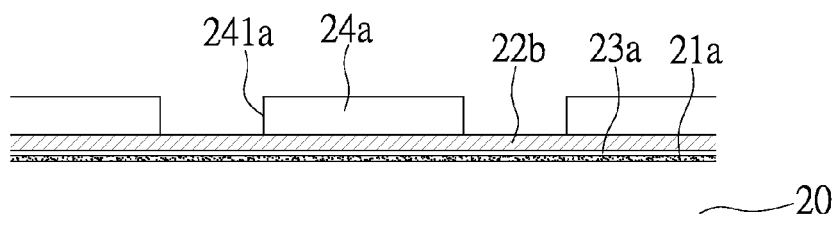

Referring to FIG. 4C, a first resist layer 24a is formed on the first plated metal layer 22b, and then a plurality of first openings 241a are formed in the first resist layer 24a such that a portion of the first plated metal layer 22b is exposed from the first openings 241a.

Figure 4D:
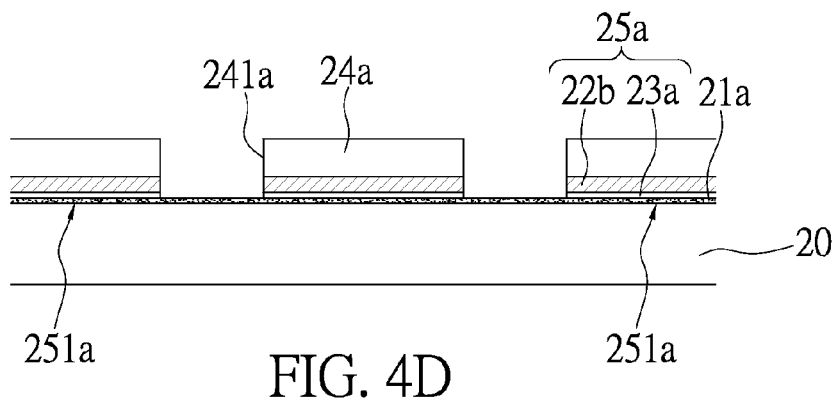

Referring to FIG. 4D, portions of the first plated metal layer 22b and the first conductive layer 23a, which are exposed from the first openings 241a, are removed, thereby allowing a first wiring layer 25a and a plurality of first lands 251a defined therein to be formed on the core board 20.

Figure 4E:
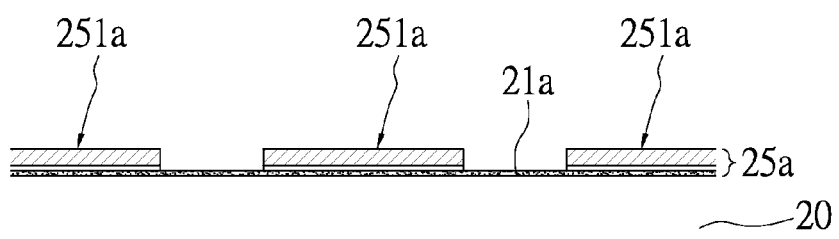

Referring to FIG. 4E, the first resist layer 24a is removed so as to expose the first wiring layer 25a and the first bonding layer 21a, and then the fabrication steps shown in FIGS. 2H to 2P are performed so as to form the second wiring layer 25b and the circuit build-up structure 27.

By the above fabrication method, the present invention further provides a circuit board, comprising: a core board 20; a first bonding layer 21a disposed on the core board 20; and a first wiring layer 25a disposed on the first bonding layer 21a, wherein a portion of the first wiring layer 25a is defined with a plurality of first lands 251a. The first wiring layer 25a further comprises a first conductive layer 23a and a first plated metal layer 22b.

The circuit board of the present invention further comprises: a first dielectric layer 26a disposed on the first wiring layer 25a and the first bonding layer 21a; a second bonding layer 21b disposed on the first dielectric layer 26a; a second wiring layer 25b disposed on the second bonding layer 21b, wherein a portion of the second wiring layer 25b is defined with a plurality of second lands 252b; and a second conductive layer 23b disposed between the second bonding layer 21b and the second wiring layer 25b.

The circuit board of the present invention further comprises: a circuit build-up structure 27 disposed on the second wiring layer 25b and the second bonding layer 21b. The circuit build-up structure 27 comprises at least a second dielectric layer 26b, a third bonding layer 21c superimposed on the second dielectric layer 26b, a third wiring layer 25c superimposed on the third bonding layer 21c, and a plurality of conductive vias 271 formed in the second dielectric layer 26b and electrically connected to the third wiring layer 25c. The conductive vias 271 are electrically connected to the second lands 252b defined in the second wiring layer 25b. The circuit build-up structure 27 further comprises a plurality of electrically connecting pads 272 conductive to the third wiring layer 25c. An insulated protection layer 28 is disposed on the circuit build-up structure 27. A plurality of openings 280 are formed in the insulated protection layer 28 such that the electrically connecting pads 272 are exposed from the openings 280.

The circuit board of the present invention further comprises: a plurality of conductive posts 30a, 30b, 30c disposed on the electrically connecting pads 272, and a conductive material 31a, 31b, 31c disposed on the conductive posts 30a, 30b, 30c. The conductive material 31a, 31b, 31c is solder. A reflowing step is performed on the conductive material 31a, 31b, 31c so as to form conductive components 31a', 31b', 31c' for covering the conductive posts 30a, 30b, 30c.

The present invention provides a circuit board and a method for fabricating the same. The circuit board of the present invention comprises: a first bonding layer for bonding a first wiring layer to a core board, a second bonding layer for bonding a second wiring layer to a first dielectric layer, and a third bonding layer for bonding a third wiring layer to a second dielectric layer in a subsequently fabricated circuit build-up structure. The first, second, and third bonding layers enhance bonding strength, prevent the first, second, and third wiring layers from undergoing delamination in an ensuing fabrication process, and enhance bonding strength of a fine-pitch circuit process.

The foregoing specific embodiments are only illustrative of the features and functions of the present invention but are not intended to restrict the scope of the present invention. It is apparent to those skilled in the art that all equivalent modifications and variations made in the foregoing embodiment according to the spirit and principle in the disclosure of the present invention should fall within the scope of the appended claims.

What is claimed is:

1. A circuit board, comprising:
a core board;
a first bonding layer disposed on the core board;
a first wiring layer disposed on the first bonding layer and comprising a first conductive layer and a first plated metal layer;
a first dielectric layer disposed over the first wiring layer and the first bonding layer;
a second bonding layer disposed on the first dielectric layer;
a second wiring layer disposed on the second bonding layer; and
a second conductive layer disposed between the second bonding layer and the second wiring layer.

2. The circuit board of claim 1, wherein the first wiring layer further comprises a first thinned metal layer disposed between the first bonding layer and the first conductive layer.

3. The circuit board of claim 1, wherein a portion of the first wiring layer is defined with a plurality of first lands.

4. The circuit board of claim 2, wherein a portion of the second wiring layer is defined with a plurality of second lands.

5. The circuit board of claim 3, further comprising a circuit build-up structure disposed on the second wiring layer and the second bonding layer.

6. The circuit board of claim 5, wherein the circuit build-up structure comprises at least a second dielectric layer, a third bonding layer superimposed on the second dielectric layer, a third wiring layer superimposed on the third bonding layer, and a plurality of conductive vias formed in the second dielectric layer and electrically connected to the third wiring layer.

7. The circuit board of claim 6, wherein the conductive vias are electrically connected to the second lands defined in the second wiring layer, and the circuit build-up structure comprises a plurality of electrically connecting pads conductive to the third wiring layer.

8. The circuit board of claim 7, further comprising an insulated protection layer disposed on the circuit build-up structure and formed with a plurality of openings for exposing the electrically connecting pads.

* * * * *